(12) United States Patent
Dietz et al.

(10) Patent No.: US 7,463,028 B2
(45) Date of Patent: Dec. 9, 2008

(54) DEVICE FOR INSTALLING A CYLINDRICAL GRADIENT COIL IN A CYLINDRICAL MAGNET OF A MAGNETIC RESONANCE SYSTEM

(75) Inventors: Peter Dietz, Fürth (DE); Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/620,168

(22) Filed: Jan. 5, 2007

(65) Prior Publication Data
US 2007/0180692 A1 Aug. 9, 2007

(30) Foreign Application Priority Data
Jan. 5, 2006 (DE) .................. 10 2006 000 925

(51) Int. Cl.
*G01V 3/00* (2006.01)
(52) U.S. Cl. .................. 324/318; 600/422
(58) Field of Classification Search ......... 324/300–322; 600/410–435
See application file for complete search history.

(56) References Cited

U.S. PATENT DOCUMENTS

| | | | | |
|---|---|---|---|---|
| 5,610,521 A | * | 3/1997 | Zou et al. ............ | 324/318 |
| 5,783,943 A | * | 7/1998 | Mastandrea et al. ...... | 324/318 |
| 5,952,830 A | * | 9/1999 | Petropoulos et al. ...... | 324/318 |
| 6,208,142 B1 | | 3/2001 | Wagshul | |
| 6,501,275 B1 | * | 12/2002 | Westphal ............... | 324/319 |
| 6,518,761 B2 | * | 2/2003 | Roozen et al. .......... | 324/318 |
| 6,777,936 B2 | * | 8/2004 | Schaaf .................. | 324/318 |
| 6,864,683 B2 | * | 3/2005 | Schuster et al. ........ | 324/318 |
| 6,894,497 B2 | * | 5/2005 | Renz .................... | 324/318 |
| 7,161,353 B2 | * | 1/2007 | Schaaf et al. .......... | 324/318 |
| 7,191,513 B2 | | 3/2007 | Schuster et al. | |
| 7,256,581 B2 | * | 8/2007 | Schuster et al. ........ | 324/318 |
| 2005/0027190 A1 | | 2/2005 | Chiodo | |

FOREIGN PATENT DOCUMENTS

EP 0 552 542 7/1993

* cited by examiner

*Primary Examiner*—Dixomara Vargas
(74) *Attorney, Agent, or Firm*—Schiff Hardin LLP

(57) ABSTRACT

A device for installing a gradient coil into a magnet of a magnetic resonance system has a frame with a coil carrier passing through the gradient coil and accommodating the gradient coil. The coil carrier is arranged on two lateral supports, upon which the frame stands on the base, with devices for generating an air cushion that carries the frame being provided on the supports.

18 Claims, 2 Drawing Sheets

DEVICE FOR INSTALLING A CYLINDRICAL GRADIENT COIL IN A CYLINDRICAL MAGNET OF A MAGNETIC RESONANCE SYSTEM

BACKGROUND OF THE INVENTION

1. Field of the Invention

The invention relates to a device for installing a usually cylindrical gradient coil in a usually hollow cylindrical magnet of a magnetic resonance system, of the type having a frame with a coil carrier passing through the gradient coil and accommodating it, the coil carrier being arranged on two lateral supports, on which the frame stands on the base.

2. Description of the Prior Art

Fitting a gradient coil into the cylindrical main field magnet of a magnetic resonance system is a complicated, operation not least because of the considerable weight of the gradient coil as well as the available space. An installation device thus is used to fit the coil. This has a frame with a coil carrier, which rests on the floor on two lateral supports. The coil carrier passes through the coil that is suspended thereon. For installation, this frame is moved as near as possible to the main field magnet. In order to be able to insert the gradient coil, the gradient coil being aligned accurately with respect to the mounting hole of the main field magnet by means of the corresponding height setting. A further support with an extendable support element is positioned on the opposite side of the main field magnet, the extendable support element passing through the main field magnet. This extension bearer is connected to the coil carrier of the frame, and the one of the supports of the frame is arranged directly adjacent to the magnet, which would prevent an insertion movement of the gradient coil into the magnet, is dismantled. The load carrying system is then supported only by the one frame-side support and the additional support arranged on the other side of the magnet. The gradient coil then can be pushed into the main field magnet from the frame-side coil carrier on the extendable support element and can be attached there at its axial position by suitable fixing means. This mounting device as well as its operation is complicated and requires a series of individual installation and dismantling steps. With longer systems in particular, especially with systems having a 7 T-main field magnet, having a length of significantly more than 3 m, difficulties arise due to the large overall length of the carrier, which must accommodate the overall gradient coil load.

SUMMARY OF THE INVENTION

An object of the invention is to provide an improved device that is simplified in terms of its operation, and that facilitates the installation of the usually essentially cylindrical gradient coil into the usually hollow cylindrical main field magnet.

This object is achieved in accordance with the invention by a type described above wherein apparatuses for generating an air cushion that supports the frame are provided on the supports.

With the device according to the invention, unlike in the prior art, the entire frame with the gradient coil is inserted into the main field magnet, for which purpose a number of air cushions are used. The frame thus is inserted into the magnet floating on an air cushion. To this end, the frame is positioned directly in front of the bore of the main field magnet by a corresponding support or positioning apparatus, such as a trolley upon which the frame stands. An air cushion is then generated by the devices on the support side, the air cushion lifting the frame, so that it floats on a few tenths of millimeters or millimeter thick air cushions. The floating frame together with the gradient coil can now be inserted into the main field magnet by the trolley for instance, which is aligned flush with the main field magnet bore, with the frame continuously floating on the air cushion. After the end position is reached and appropriate support has been provided for the gradient coil to fix it axially and radially, the generation of air cushions is terminated, so that the frame is standing directly on the support and can be dismantled.

The inventive frame is significantly easier to handle than conventional frames after the frame is inserted completely into the magnet. Complicated installation steps as in the prior art for lengthening the bearer, etc, are not necessary. The frame is composed of a few parts, with all components used on the frame, such as the devices for generating the air cushion and the transportation facility such as the already described trolley for instance, being manufactured from non-magnetic materials, so that the gradient coil can be mounted with the magnetic field in place. It is thus not necessary to shut down the main field magnet in order to install or remove a gradient coil, which with large magnets in particular, such as a 7 T-magnets, requires several days.

In a further embodiment of the invention, a curved support element, adjusted in terms of its radius relative to the radius of the hollow cylindrical magnet is provided on each support. On the exterior of this support element, at least one seal acting on the base is provided, and on which at least one outlet opening for supplied air is provided in the region sealed by the seal. In accordance with the invention, the support element on the support side is adjusted in terms of its radius to that of the magnet bore, so that a relatively large surface area around the magnetic field bore can be sealed by the sealing means provided on the bearer side. Air is forced into this region by an external pressurized air supply, this air then discharging below the seal and forming the thin air film and/or air cushion. This means that the air cushion is generated on a relatively large surface, so that a more secure guidance of the frame is also provided in the magnet.

The seal is preferably an inflatable, preferably elastic, sealing tube, which can be inflated by a separate air supply. A very good seal to the base can be achieved by such an inflatable sealing tube, so any unevenness can also be very effectively accommodated. Appropriate connection for an air supply is naturally provided on such a sealing tube. A one-piece sealing tube is preferably used, which restricts the overall air cushion region. As an alternative to using a sealing tube, it is also conceivable to use a sealing cord, preferably an elastic sealing cord, namely a seal made of solid material.

In order to supply the air required to generate the air cushion, a connection for an air supply line is expediently provided on each support, in particular on each support element. The air supply line is coupled to a compressed air supply such as a pump or the like.

Furthermore, in the absence of an air cushion, one or more supporting elements for supporting the frame against the base is provided on each support element. The frame rests on these supporting elements, but not directly, or at least not with a full load, on the seal.

For simple accommodation of the gradient coil to be installed or de-installed, as well as for simple dismantling of the frame after positioning the gradient coil, the coil carrier can be formed of two detachably connected parts. Alternatively, at least one support is detachably connected to the coil carrier.

As already described, the invention expediently further has a transportation or positioning unit for the frame. A trolley is preferably used, so that the frame, together with gradient coil to be used, can be assembled away from the magnet and can only be transported to the magnet when required. A trolley having a base adjusted to the shape of the device on the support side for generating an air cushion is preferably used, with the base preferably likewise being curved and its radius corresponding to that of the cylindrical magnet. In other words, the base virtually continues the surface of the inner wall of the magnet bore, so that the frame can be inserted continuously into the magnet from the base of the trolley. The base itself, or as the case may be also the entire trolley, can be height adjustable, so that the base can be aligned exactly in relation to the magnetic field bore and can compensate for any possible step to the magnet.

Furthermore, rollers can be provided, which operate on the support side, to position the frame on the base on the carriage side. These rollers no longer come into contact with the respective base when the air cushion lies adjacent thereto, and therefore no longer need to function.

The trolley itself is preferably mounted on rollers, and if applicable can also include a device for generating an air cushion to carry the trolley. The trolley can be positioned roughly with respect to the magnetic field bore by the rollers. An exact alignment then can be achieved after generating the air cushion which lifts the trolley by a minimal amount, as the trolley can be extremely easily moved on the air cushion and subsequently aligned, if applicable in conjunction with docking elements provided on the carriage and magnet sides.

DESCRIPTION OF THE PREFERRED EMBODIMENTS

Figure 1:
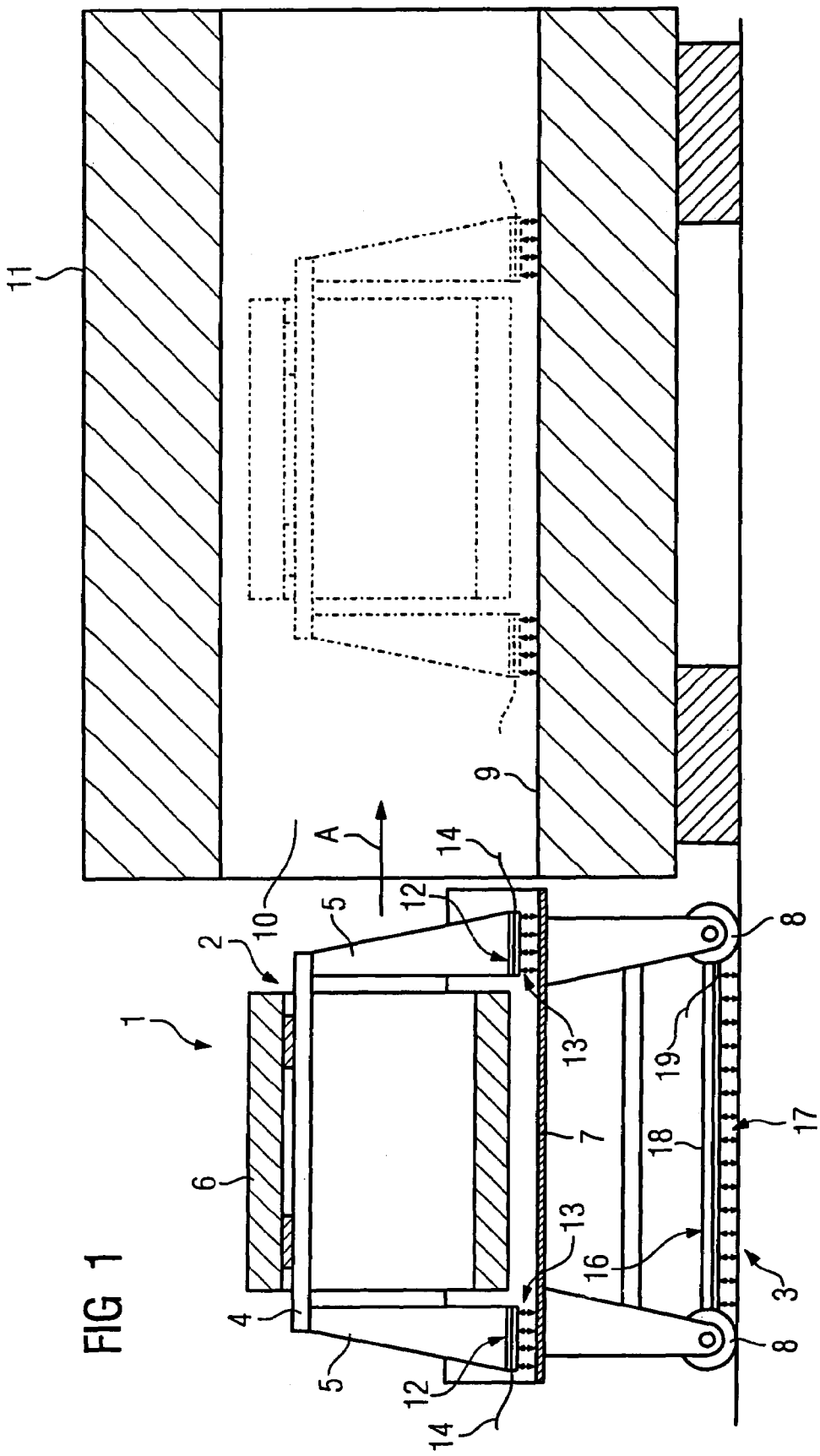
FIG. 1 schematically shows a device according to the invention and the operation thereof for placing a gradient coil in a cylindrical main field magnet.

FIG. 1 shows an inventive device 1, having a frame 2 and a trolley 3.

The frame 2 has a coil carrier 4, on the ends of which are provided two supports 5, with which the frame 2 with the gradient coil 6 on the coil carrier 4 stands and/or is supported on a base, here the base 7 of the trolley 3. The frame 2 can be dismantled into at least two parts, in other words, the coil carrier 4 is in two-pieces and can be taken apart. Alternatively it is also conceivable to detach one of the supports 5 in a simple manner from the coil carrier 4, in order to insert the frame 2 either to accommodate a gradient coil 6 or to dismantle and remove the frame again after inserting a gradient coil 6.

Figure 2:
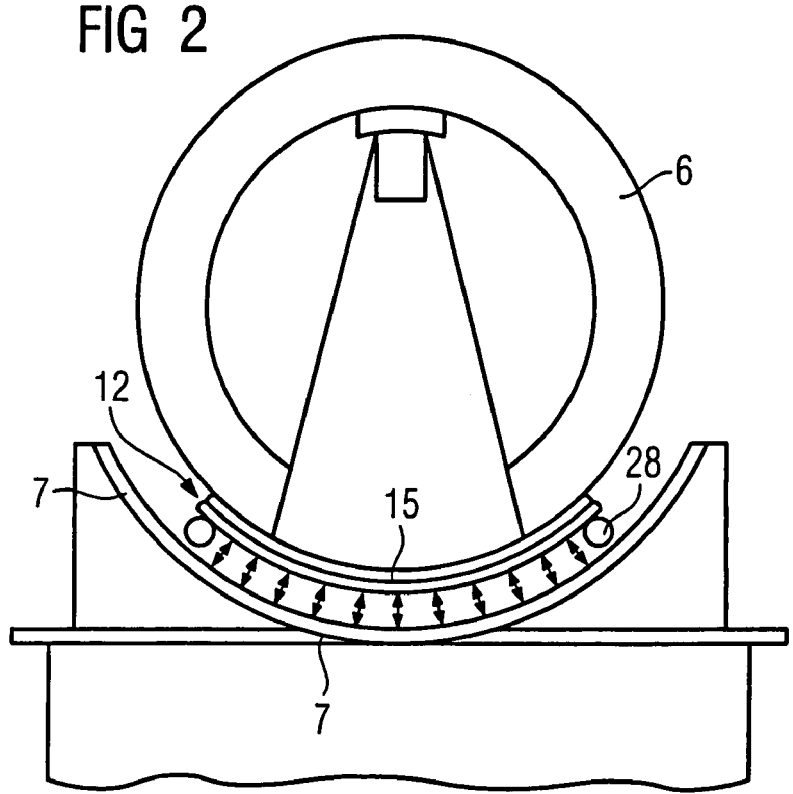
FIG. 2 shows a front view of the device of FIG. 1.

The trolley 3 is mounted in a moveable fashion on rollers 8. The base 7, see FIG. 2, is a curved design, with the curve radius corresponding as accurately as possible to the radius of the inner wall 9 of the bore 10 of the cylindrical main field magnet 11, which is part of a magnetic resonance system. This means that the base 7 positioned directly adjacent to the bore 10 virtually lengthens the inner wall 9 of the bore. Here the main field magnet 11 is a 7 T-magnet with a length of ≧3 m for instance, the gradient coil 6, which is a whole body coil, is significantly shorter. The term "gradient coil" describes a conventional coil system having a number of individual coils assigned to the three directions in space in order to generate the individual gradient fields.

Devices 12 for generating an air cushion are provided in each instance on the undersides of the supports 5, said air cushion being able to be arranged in order to move the frame 2 together with gradient 6 if necessary. The frame 2 and the gradient coil 6 now float on this air cushion 13, which is indicated here by way of example via the arrows, and as shown by arrow A, can be completely moved into the bore 10 and positioned. Corresponding air lines 14 are connected or can be connected to the device 12 in order to generate the air cushion, this being discussed further below. The air lines 14 are connected to a suitable compressed air supply such as a pump or suchlike. After positioning of the frame 2 together with the gradient coil 6, the gradient coil 6 is fixed axially and radially, whereupon the frame 2 is dismantled and removed, naturally after the air cushions have been switched off.

As FIG. 2 shows, a device 12 for generating an air cushion 13 comprises a curved support element 15, on which seals for sealing a space are provided, this being explained further below, into which space the compressed air required to generate the air cushion is forced. The support element 15 likewise has a curved design, with the curve radius being matched to the curve radius of the base 7 and thus the radius of the inner wall 9 of the main field magnet 11. Due to this curved embodiment of the support element 15, a large surface can be sealed by the seal, as discussed in more detail below, so that a relatively large-surface air cushion can be generated upon which the frame floats.

In addition to the frame 2, the trolley 3 can also feature a device 16 for generating an air cushion 17. A corresponding support element 18 is additionally provided, to which are assigned corresponding sealing means, which are not shown in further detail here, the air supply is also provided here by way of a corresponding air line 19. The trolley can be positioned relatively roughly in terms of the magnet bore 10 by way of the transport rollers 8 allowing linear guidance. The air cushion 17 can subsequently be switched on, by way of which it can be moved in any direction in respect of the bore to achieve an accurate alignment.

Figure 3:
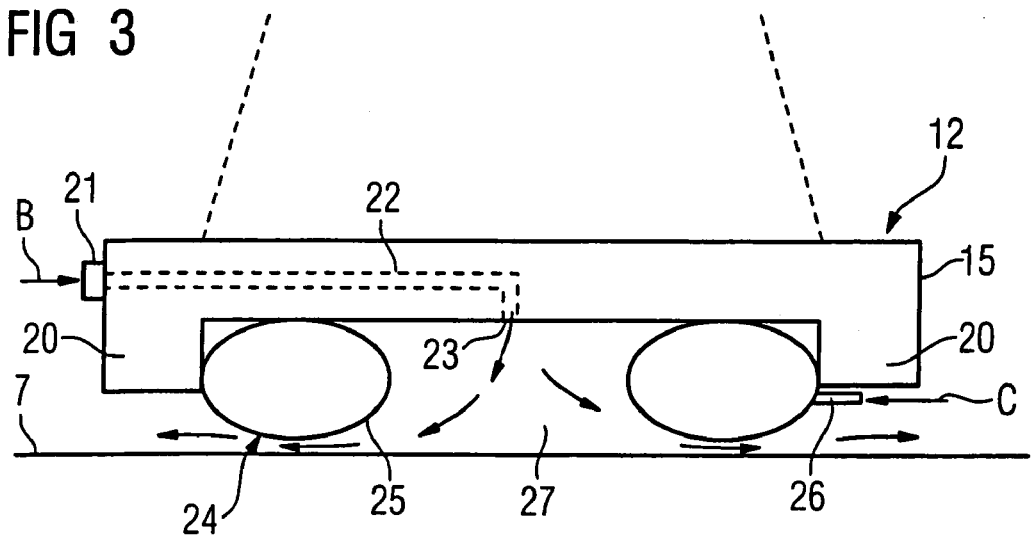
FIG. 3 schematically shows a device provided on the support side for generating an air cushion.

FIG. 3 shows a schematic diagram of an enlarged view of a device 12 for generating an air cushion 14, with this basic design applying to the device 16 as well. The support element 15 is shown, which is curved in this embodiment. It has supporting elements 20 on the edges, on which supporting elements the frame rests on the base 7 when the air cushion is not switched on.

A connection 21 for the air line 14 (not shown here in further detail) is provided on the support element 15, this can be connected in a detachable fashion. An air duct 22, which if necessary, can branch in any manner over the length and width of the bearer, leads into the center of the bearer and ends in an outlet opening 23 in the example shown, it can however also serve a plurality of outlet openings and/or end in any number.

A seal 24 is further shown, here in the form of a one-piece, surrounding, inflatable sealing tube 25 made from a preferably elastic material, the sealing tube 25 having a connection 26 for an air line, via which the air required for inflation is supplied.

If the air cushion is now to be generated, air is supplied via the air line 14, as shown by arrow B. Compressed air is likewise fed, beforehand or simultaneously, over the air line leading to the sealing tube 25 (not shown here in further detail), as shown by arrow C, so that the seal 24 is inflated.

The air supplied according to arrow B enters the sealed region 27, and, as a result of the high pressure with which it is supplied flows out below the seal 24 which has thus far been resting on the base 7, so that a very thin air film forms below the seal, thereby forming the air cushion on which the entire frame rests. The flow direction arrows indicate the air flow from the sealed region 27 below the sealing means 24 into the external region. Provided the air supply is carried out according to arrow B, the air cushion remains intact, in other words, the frame 2 can be moved onto the air cushion in an effortless and floating fashion.

FIG. 2 finally shows another roller 28, which is arranged on the support element 15, and which serves to position the frame on the base 7, if the frame is placed on the base and no air cushion is generated. As soon as the air cushion is generated, the rollers are no longer in contact the base and thus no longer have any function.

We claim as our invention:

1. A device for installing a gradient coil into a magnet of a magnetic resonance system, said device comprising:
   a base;
   a frame comprising two lateral supports each having a bottom surface on which said frame rests on said base, and a coil carrier supported by said two lateral supports, said coil carrier being configured to pass through and accommodate a gradient coil;
   air-discharge devices respectively disposed at the bottom surface of each of said two lateral supports that discharge air from the devices to generate an air cushion that lifts said frame from, and non-fixedly supports said frame above, said base; and
   said base being configured for placement next to an opening of a magnet of a magnetic resonance system and said air cushion allowing manual displacement of said frame, and said coil carrier with a gradient coil accommodated thereon, from said base into said opening of said magnet while continuously floating on said air cushion.

2. A device as claimed in claim 1 wherein said magnet is a hollow cylindrical magnet having a bore therethrough with an inner bore radius, and wherein each base of each of support comprises a curved support element having a support element radius matched to said inner bore radius, and a seal that interacts with said base to confine said air cushion to a region sealed by said seal, and at least one outlet opening proceeding through said bottom surface to supply air to said region, to generate said air cushion.

3. A device as claimed in claim 2 wherein said seal comprises an inflatable sealing tube.

4. A device as claimed in claim 3 wherein said sealing tube is elastic.

5. A device as claimed in claim 2 wherein said seal is an elastic sealing cord.

6. A device as claimed in claim 1 wherein each of said supports comprises a connection adapted to connect to an air supply line to generate said air cushion.

7. A device as claimed in claim 1 wherein each of said support elements comprises auxiliary support elements at the bottom surface thereof to support that support element on said frame in an absence of said air cushion.

8. A device as claimed in claim 1 wherein said coil carrier comprises two detachably connected parts.

9. A device as claimed in claim 1 wherein said coil carrier is detachably connected to at least one of said lateral supports.

10. A device as claimed in claim 1 comprising a trolley on which said base is mounted allowing movement of said base and said frame thereon toward and away from said magnet.

11. A device as claimed in claim 10 wherein said magnet is a hollow cylindrical magnet having a bore therethrough with an inner bore radius, and wherein said base is curved with a base radius conforming to said inner bore radius.

12. A device as claimed in claim 10 wherein said base is height-adjustably mounted on said trolley.

13. A device as claimed in claim 10 wherein each of said lateral supports, at the bottom surface thereof, has rollers mounted thereon allowing positioning of said frame on said base in an absence of said air cushion.

14. A device as claimed in claim 10 wherein said trolley comprises rollers allowing movement of said trolley toward and away from said magnet.

15. A device as claimed in claim 14 wherein said trolley comprises a further device for generating an air cushion beneath said trolley to lift said trolley from a floor.

16. A device as claimed in claim 15 wherein said trolley and said further device for generating an air cushion are comprises of non-magnetic materials.

17. A device as claimed in claim 10 wherein said trolley is comprised of non-magnetic materials.

18. A device as claimed in claim 1 wherein said frame and said base and said device for generating an air cushion are comprised of non-magnetic materials.

* * * * *